United States Patent [19]

Ramesham et al.

[11] Patent Number: 4,931,763

[45] Date of Patent: Jun. 5, 1990

[54] MEMORY SWITCHES BASED ON METAL OXIDE THIN FILMS

[75] Inventors: Rajeshuni Ramesham; Anilkumar P. Thakoor, both of Pasadena, Calif.; John J. Lambe, Redmond, Wash.

[73] Assignee: California Institute of Technology, Pasadena, Calif.

[21] Appl. No.: 157,318

[22] Filed: Feb. 16, 1988

[51] Int. Cl.[5] .................. H01C 7/10; H01C 1/012
[52] U.S. Cl. .................. 338/22 SD; 338/308
[58] Field of Search ............... 337/166, 297; 365/163, 365/144; 338/47, 22 DS, 306, 308; 350/351; 313/398; 340/825.83, 825.81

[56] References Cited

U.S. PATENT DOCUMENTS

| | | | |
|---|---|---|---|
| 3,629,863 | 12/1971 | Neale | 365/163 |
| 3,766,508 | 10/1973 | Wada et al. | 337/166 X |
| 4,682,206 | 7/1987 | Tsuya et al. | 357/4 X |

*Primary Examiner*—Bruce A. Reynolds
*Assistant Examiner*—Marvin M. Lateef

*Attorney, Agent, or Firm*—Ashen, Golant, Martin & Seldon

[57] ABSTRACT

$MnO_{2-x}$ thin films (12) exhibit irreversible memory switching (28) with an "OFF/ON" resistance ratio of at least about $10^3$ and the tailorability of "ON" state (20) resistance. Such films are potentially extremely useful as a "connection" element in a variety of microelectronic circuits and arrays (24). Such films provide a pre-tailored, finite, non-volatile resistive element at a desired place in an electric circuit, which can be electrically turned OFF (22) or "disconnected" as desired, by application of an electrical pulse. Microswitch structures (10) constitute the thin film element, contacted by a pair of separate electrodes (16a, 16b) and have a finite, preselected ON resistance which is ideally suited, for example, as a programmable binary synaptic connection for electronic implementation of neural network architectures. The $MnO_{2-x}$ microswitch is non-volatile, patternable, insensitive to ultraviolet light, and adherent to a variety of insulating substrates (14), such as glass and silicon dioxide-coated silicon substrates.

10 Claims, 3 Drawing Sheets

MEMORY SWITCHES BASED ON METAL OXIDE THIN FILMS

The invention described herein was made in the performance of work under a NASA contract, and is subject to the provisions of Public Law 96-517 (35 U.S.C. 202) in which the Contractor has elected to retain title.

TECHNICAL FIELD

The present invention relates broadly to electronic memories based on neural networks, and, more particularly, to irreversible memory switches employing thin films of manganese dioxide or lead dioxide.

BACKGROUND ART

Neural network models offer a totally new approach to intelligent information processing that is robust, fault tolerant, and can be extremely fast. Such neural networks are discussed, for example, in A. P. Thakoor et al, "Binary Synaptic Connections Based on Memory Switching in a-Si:H", *Neural Networks for Computing*, J. S. Denker, Ed., American Institute of Physics Conference Proceedings $\#151$, Snowbird, UT, pp. 426–431 (1986).

The aforementioned features originate directly from the massive interconnectivity of neurons (the decision-making elements) in the brain and its ability to store information in a distributed manner as a large number of synaptic interconnects of varying strengths. Hardware implementations of neural network concepts, therefore, are attracting considerable attention. Such artificial neural networks are expected, for example, to function as high speed, content addressable, associative memories in large knowledge bases for artificial intelligence applications and robotics or to perform complex computational tasks such as combinatorial optimization for autonomous systems.

In particular, electronic implementation of an associative memory based on neural network models requires large arrays of extremely simple, binary connection elements or synaptic interconnects. Information is essentially stored in the binary states of the interconnects. Non-volatile storage of information therefore can take place at the time of fabrication of the synaptic array by making the resistive state of the desired interconnect "ON" or "OFF". Alternatively, significantly more useful memory systems can be built if programmable, binary resistive thin film devices (non-volatile microswitches) are used as synaptic interconnects.

Non-volatile, programmable, associative electronic memories based upon neural network models, with dense synaptic interconnection arrays in thin-film form, have recently been developed, using memory switching in hydrogenated amorphous silicon (a-Si:H). The highly parallel nature of neural network circuits requires the "ON" connections in large synaptic arrays to have very weak connection strengths ($>10^6$ $\Omega$ for $1000 \times 1000$ matrix). Such weak connections are needed to limit the current in the wires to a reasonable density (to avoid electromigration) as well as the overall power dissipation.

Irreversible (OFF$\rightarrow$ON) memory switching in existing hydrogenated amorphous silicon (a-Si:H) thin films, however, results in an uncontrollable "ON" state resistance ($<10^6$ $\Omega$), which makes them inappropriate for their use as programmable, binary weak synaptic interconnections with any precision. A current limiting (synaptic) resistance ($\approx 10^6$ $\Omega$) is required in series with such switching materials to obtain the desired "ON" resistance of the node when switched, which in turn complicates the microswitch structure.

DISCLOSURE OF INVENTION

In accordance with the invention, a thin film element comprising a metal oxide, such as manganese oxide, is capable of irreversibly switching from a conducting ON state to a non-conducting OFF state by application of voltage or heat. The switching is accomplished by providing a metal oxide of a first composition having a resistivity that may be tailored by the deposition parameters. Application of voltage or heat converts the oxide of the first composition to an oxide of a second composition having a resistivity much higher than that of the first composition.

A process is provided for forming the first composition and a method is provided for irreversibly converting the first composition to the second composition.

The thin films provided in accordance with the invention exhibit irreversible memory switching with an "OFF/ON" resistance ratio of at least about $10^3$ (but can be as high as $10^8$) and the tailorability of "ON" state resistance. Such films are potentially extremely useful as a "connection" element in a variety of microelectronic circuits and arrays. Such films provide a pre-tailored, finite, non-volatile resistive element at a desired place in an electronic circuit, which can be electronically turned OFF or "disconnected" as desired, by application of an electrical pulse.

Microswitch structures comprise the thin film element, contacted by a pair of separate electrodes and have a finite, pre-selected ON resistance which is ideally suited, for example, as a programmable binary synaptic connection for electronic implementation of neural network architectures. The microswitch is nonvolatile, patternable, insensitive to ultraviolet light, and adherent to a variety of insulating substrates, such as glass and silicon dioxide-coated silicon substrates.

BEST MODES FOR CARRYING OUT THE INVENTION

Resistivity-tailored ($\approx 3$ $\Omega$-cm) $MnO_{2-x}$ thin film microswitches exhibit irreversible, non-volatile memory switching with an "OFF/ON" resistance ratio of at least about $10^3$.

$MnO_{2-x}$ films are patternable, insensitive to ultraviolet light, and adhere well to glass as well as silicon dioxide-coated silicon substrates.

Figure 1:
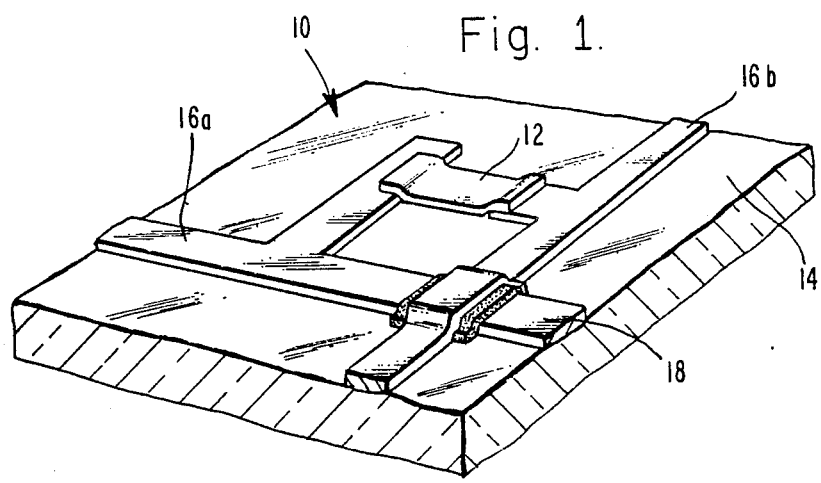
FIG. 1 is a perspective view of one embodiment of the memory switch of the invention.

Although there are many configurations in which the thin film microswitch of the invention may be employed, one such configuration is depicted in FIG. 1.

There, the thin film microswitch 10 of the invention is shown, comprising a thin film strip 12 supported on a substrate 14 between two metal contacts 16a, 16b. While the metal contacts 16a, 16b bridge, an insulating pad 18 provides electrical isolation. The insulating pad 18 may comprise polyimide, alumina, silicon nitride, silicon dioxide, magnesium oxide, or other suitable insulating material.

The following discussion of the thin film microswitch switch 10 of the invention is primarily directed to $MnO_{2-x}$ films, which are preferred. Such films 12, upon application of voltage or heat, convert from an initially conducting ON state to an irreversible, nonconducting OFF state. In the case of $MnO_{2-x}$ (conducting), the value of x is initially very small. Switching to the OFF state, however, changes the value of x to about 0.5, thus converting the thin film 12 to predominantly stoichiometric $Mn_2O_3$ (non-conducting).

Another example of a suitable oxide is lead dioxide, which converts from $PbO_{2-x}$ (conducting, ON state) to PbO (non-conducting, OFF state). Any metal oxide system having two stable phases, with a transition from one phase to the other attainable by some convenient means, such as by application of an electric field, heat or electromagnetic radiation, may be used in the practice of the invention, so long as the ratio of resistivities is sufficiently high ($\approx 10^3$) and so long as the oxides are patternable and adhere to the substrate.

The mechanism of switching is the chemical transformation of conducting ($\approx \Omega$-cm) $MnO_{2-x}$ to insulating ($10^5$ to $10^8$ $\Omega$-cm) $Mn_2O_3$. The reaction of decomposition and loss of oxygen is known to take place in bulk $MnO_{2-x}$ at temperatures of at least about 450° C.

Figure 2:
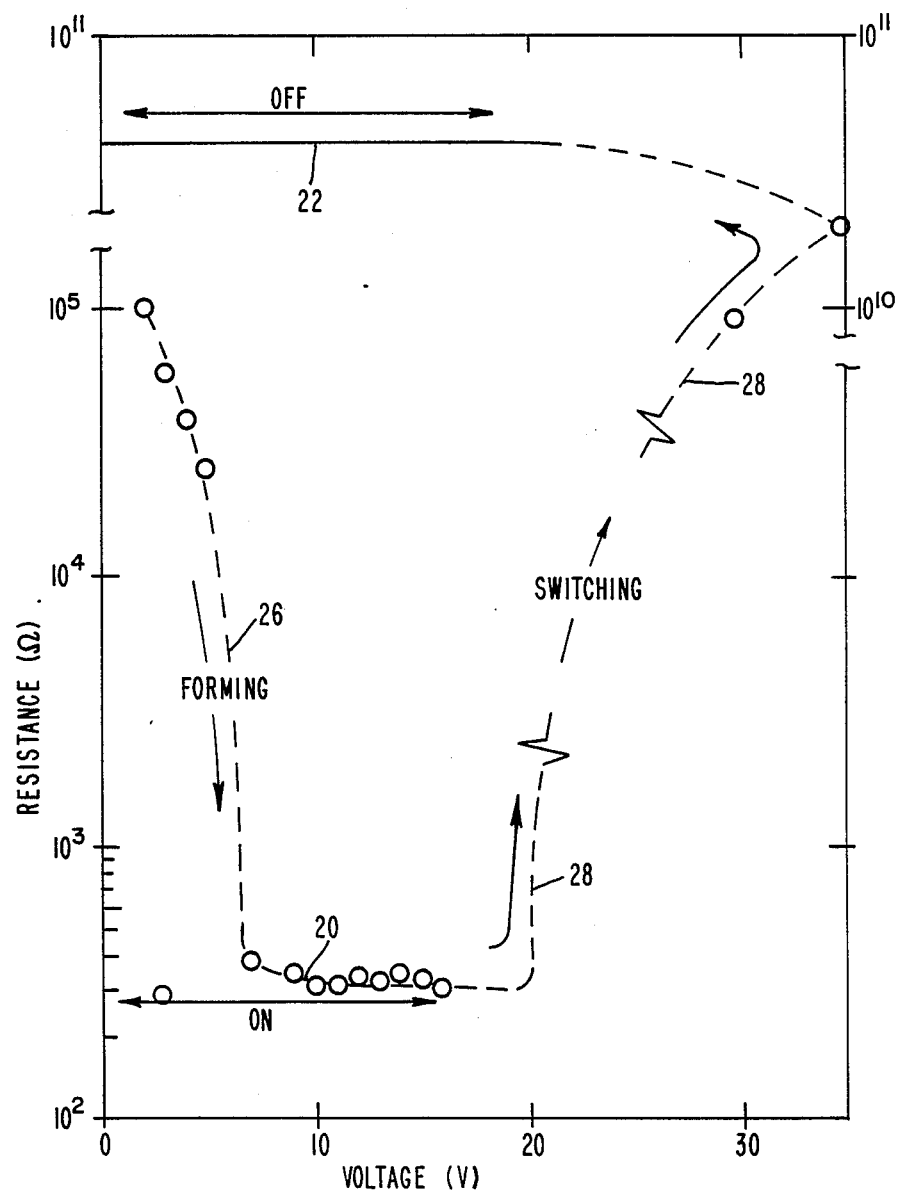
FIG. 2, on coordinates of resistance (in ohms) and voltage (in volts), is a plot depicting the switching characteristics of $MnO_{2-x}$ thin films, measured in a sandwich geometry by a microprobe tester.

Switching of the thin film 12 from the ON state 20 to the OFF state 22 is accomplished by applying a sufficiently high voltage (current) pulse (greater than a threshold value, $V_{threshold}$) across or through the oxide element, using the two metal contacts 16a, 16b, as shown in FIG. 2. The threshold voltage normally depends on the geometry (length L, width W and thickness t) and configuration (e.g., area of thin film 12 in contact with the substrate 14) of the device 10 to be switched, and the substrate material. An increase in area and a decrease in thickness of the thin film 12 require an increase in the threshold voltage value. An increase in thermal conductivity of the substrate 14 also requires an increase the threshold value.

For a given geometry, one skilled in the art can readily determine a voltage threshold and time duration for the switching pulse. By way of example, a switch 10 comprising a $MnO_{2-x}$ element 12 deposited on a glass substrate and having a length L of 5 $\mu$m, a width W of 5 $\mu$m, and a thickness of 0.2 $\mu$m requires an electric pulse of 50 V, with a 500 $\mu$sec pulse width, which results in about 300 njoules of total energy dissipation.

Use of a substrate 14 having a higher thermal conductivity than glass, such as sapphire, would require a higher threshold value. On the other hand, a further increase in the applied voltage helps to reduce the pulsewidth to a certain extent.

The purpose of applying the electrical pulse is to generate sufficient thermal energy in the $MnO_{2-x}$ resistive element 12 itself at such a rate that it reaches the decomposition temperature only locally and very quickly. If the heat ($I^2R$) generation is slow, it may be lost to the substrate 14 primarily by thermal conduction, and would not allow the microswitch 10 to reach the desired temperature.

The primary concern to reduce the overall energy utilized for switching is optimizing the geometry and configuration of the element 12 and choosing a thermally and electrically insulating substrate 14, such as $SiO_2/Si$ or glass. The substrate should be smooth and chemically to. with inert about x. Sapphire may be used as a substrate material, but as noted above, its higher thermal conductivity would require a higher threshold voltage.

Alternatively, heating the thin film element 12 to an elevated temperature, typically above about 450° C., may be used to accomplish the switching. Heating an element 12 in an array 24 of devices 10 could be done, for example, by localized laser heating. Or, all elements of an array could be heated simultaneously, such as by heating the substrate 14 to the elevated temperature.

As-deposited films 12 of $MnO_{2-x}$ are generally micropolycrystalline and have a resistivity in the range of 50 to 500 $\Omega$-cm. The resistivity of $MnO_{2-x}$ thin film elements 12 decreases with increasing temperature up to about 300° C., reaching about 3 $\Omega$-cm. This may be explained by an increase in the richness of $O_2$ (x is decreasing to almost zero in the films) and/or some grain growth by annealing.

This resistivity change has been identified as "forming" (1 to 10 $\Omega$-cm) of the device into its ON state 20. This state is stable up to about 450° C. Above this temperature, $MnO_{2-x}$ loses its oxygen by thermal decomposition and forms high resistive manganese oxide ($Mn_2O_3$; resistivity: $10^5$ to as high as $10^8$ $\Omega$-cm). This is known as the OFF state 22 of the device.

Following deposition of the thin oxide film 12 comprising the device 10, the substrate 14 may be heated to "form" all elements, along Curve 26 of FIG. 2. Alternatively, each element could be heated individually. The heating may also be accomplished by a suitable electric field pulse, by laser heating, or other wellknown thermal method.

Since $MnO_{2-x}$ films exhibit irreversible switching from ON to OFF state, unlike switching in a-Si:H (OFF→ON), the desired weak connection characteristics of the binary $MnO_{2-x}$ synapses (finite ON resistance) can be precisely tailored, as described in further detail below.

In massively parallel electronic circuits, for example, associative memories based on neural network models, overall power dissipation constraints dictate that the (synaptic) interconnects should have some finite current-limiting resistance in their ON state. The $MnO_{2-x}$ films employed herein exhibit irreversible memory switching from the ON to the OFF state, unlike switching in a-Si:H (OFF to ON). The desired weak connection characteristics of the binary $MnO_{2-x}$ synapses (finite ON resistance) can be achieved by controlling the deposition parameters during deposition of the thin oxide film 12, as described below, and optimizing the geometry and configuration of the element in the device, as discussed above. Therefore, this allows a significant simplification of synaptic configuration, since the additional series resistance is not required.

The manganese dioxide may be deposited by a variety of techniques, including reactive dc magnetron sputtering, thermal evaporation, electron beam evaporation, electrolytic deposition, etc. As deposited, the $MnO_{2-x}$ film may be amorphous or micropolycrystalline.

The reactive sputtering is performed by sputtering manganese (or other metal) in an atmosphere comprising a mixture of an inert gas and oxygen. Any of the inert gases, such as argon, xenon, radon, or krypton, may be used in the practice of the invention.

In the case of manganese dioxide, the relative ratio of the gases is critical in forming the thin film element 12. As an example, the partial pressure of the inert gas may range from about 6 to 6.5 mTorr, while the partial pressure of oxygen may range from about 1.3 to 1.5 mTorr. A partial pressure of oxygen lower than about 1.3 mTorr results in the deposition of manganese-rich metallic films, while a partial pressure greater than about 1.5 mTorr results in a non-adherent, oxide-rich film. For optimum results, the partial pressures of argon and oxygen are 6.3±0.1 mTorr and 1.4±0.1 mTorr, respectively. The argon to oxygen ratio ($\approx 4.5$), within the acceptable range, is a significant parameter to tailor the as-deposited $MnO_{2-x}$ resistivity within a range of about 50 to 500 $\Omega$-cm.

The $MnO_{2-x}$ film 12 is deposited to a thickness ranging from about 1,500 to 2,500 Å. The thickness should be at least about 1,000 Å in order to obtain a relatively pinhole-free film. Films thicker than about 2,500 Å take an unacceptably long time to deposit at deposition rates of about 0.2 to 0.3 Å/sec. Also, higher thicknesses tend to be less adherent to the substrate 14.

The metal oxide film 12 is patterned, using well-known lithographic techniques. For example, the substrate 14 may be coated with a resist, which is patterned, developed and etched. The metal oxide film is then blanket deposited, and the resist is lifted off, such as by a suitable solvent, carrying away those portions of the metal oxide film lying over the resist and leaving behind those portions of the metal oxide film contacting the substrate.

The resistance of the patterned $MnO_{2-x}$ element 12 depends on the length L, width W, and thickness t of the film, or the same parameters governing the threshold voltage. The resistance of the element also depends on the $Ar/O_2$ ratio during sputter deposition. These are the parameters useful in tailoring the ON state resistance. For example, for a length of 50 $\mu$m, a width of 10 $\mu$m, a thickness of 0.1 $\mu$m and a "formed" resistivity of about 3 $\Omega$-cm, the resistance R is about $1.5 \times 10^6$ $\Omega$. The precision over ON state resistance is achieved by controlling the $Ar/O_2$ ratio ($\approx 4.5$) and uniformity of geometry.

Metallic contacts 16a, 16b, such as nickel, typically are about 0.1 to 0.2 $\mu$m thick and about 10 $\mu$m wide. Again, while any of the well-known patterning processes may be employed, the resist lift-off technique, used in connection with the deposition of the patterned metal oxide film 12, is preferably utilized. The order of deposition (metal oxide film 12 vs. metal contact 16) is immaterial.

Memory switching (Curve 28 in FIG. 2) in $MnO_{2-x}$ thin films is an irreversible current-induced transformation. An as-deposited $MnO_{2-x}$ film (resistance $\approx 10^5$ $\Omega$) with a resistivity in the range of 50 to 500 $\Omega$-cm undergoes a forming process (Curve 26) to reach a stable, non-volatile ON state (Curve 20) (resistance $\approx 3.5 \times 10^2$ $\Omega$, resistivity in the range of 1 to 10 $\Omega$-cm), finally undergoing the switching transformation (Curve 28) to reach an OFF state (Curve 22) (resistance $3 \times 10^{10}$ $\Omega$, resistivity in the range of $10^5$ to $10^8$ $\Omega$-cm). It should be noted that the actual resistance values shown in FIG. 2 were measured by a microprobe in a sandwich geometry. They were not tailored to yield $10^6$ $\Omega$ in the ON state. The voltages required for forming and switching of $MnO_{2-x}$ in a sandwich geometry (FIG. 2) on an indium tin oxide (ITO)-coated glass substrate, with the film about 0.2 $\mu$m thick, are $\approx 10$ V and $\approx 20$ V, respectively.

Memory switching in $MnO_{2-x}$ thin films is an irreversible current induced transformation of a "formed" conductive $MnO_{2-x}$ ("ON" state; geometrically tailored to be $\approx 10^6$ $\Omega$) to a non-conductive $Mn_2O_3$ ("OFF" state; $> 10^9$ $\Omega$). This makes them ideally s as programmable binary, weak synaptic connections in associative PROM based on neural network models. Furthermore, $MnO_{2-x}$ films are patternable, insensitive to ultraviolet light, adherent to the substrate, and can be used as a microswitch without any additional current limiting resistor.

Figure 4:
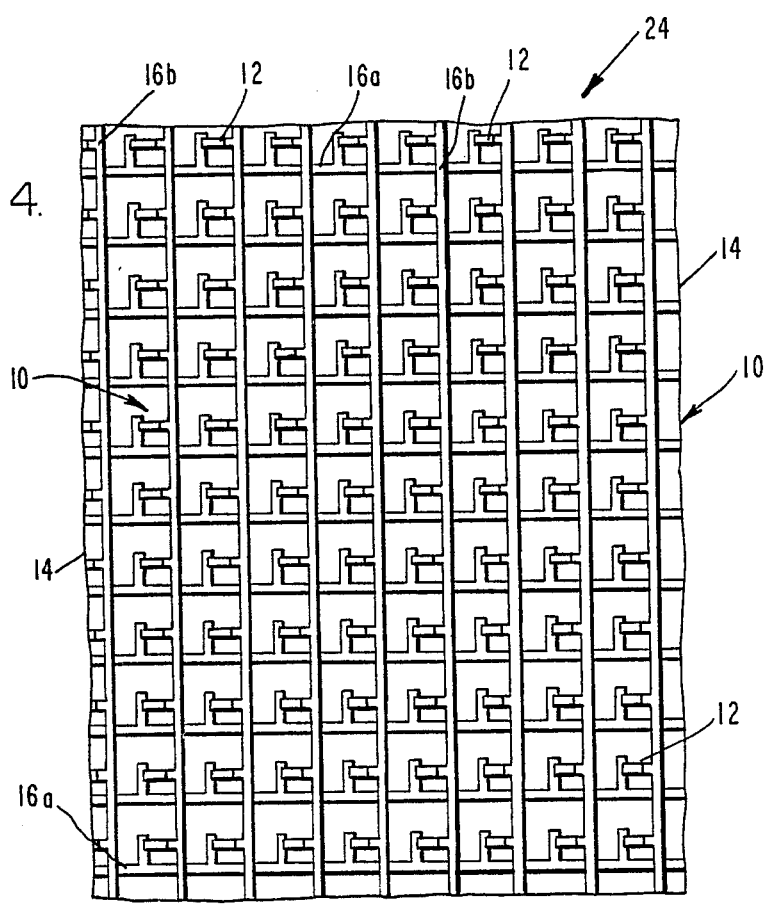
FIG. 4 is a plan view of an embodiment of the invention, depicting an array of the thin film synaptic elements illustrated in FIG. 1.

An array 24 of microswitches 10 (elements 12 and associated metallic contacts 16a, 16b) is shown in FIG. 4. In such an array, each metal contact line 16a, 16b, may optionally have a voltage less than the threshold voltage applied thereto. Wherever two such contact lines intersect, each having the applied voltage, the sum of the two voltages will be greater than the threshold voltage, thereby effecting switching of that particular element 12 from the ON state to the OFF state. Of course, many other architectures may be employed in the arrays.

Test arrays 20 comprising 40 by 40 elements 12 have been constructed. The precision in $R_{ON}$ over 1,600 synapses varied within a few percent, which is considered acceptable for this application.

Since the synapses are simple, their size can be scaled down, approaching even submicrometer dimensions and thereby permit achieving synaptic densities over $10^8$ nodes/cm.

INDUSTRIAL APPLICABILITY

Switching is broadly shown as making, breaking, or changing of connections in an electrical circuit or changing the signal level between two distinct values. This is an important operation in electronic computing, information processing, and automatic control. Because of their reliability, speed, and small size, solidstate switching devices have replaced mechanical moving-contact switches and relays in most modern microelectronic technologies.

$MnO_{2-x}$ thin films exhibit irreversible, "resistive" memory switching, with an OFF/ON resistance ratio of at least about $10^3$. Such films are potentially useful as a "connection" element in a variety of microelectronic circuits. Such films provide a pre-tailored, finite, non-volatile resistive element at a desired place in an electronic circuit, which can be electronically turned OFF or "disconnected" as desired by application of an electrical pulse.

In particular, such a microswitch structure 10 with a finite, pre-tailored ON resistance is ideally suited as programmable binary synaptic connections, without any additional current limiting resistive components, in electronic associative memories based on neural network models, characterized by their highly parallel architecture.

EXAMPLES

1. Thin Film Elements and Devices.

$MnO_{2-x}$ thin films about 2,000 Å thick were deposited onto a conducting oxide/glass substrate to tailor their resistivity, prior to fabrication of synaptic test structures. The conducting oxide comprised indium-tin oxide (ITO). The manganese dioxide films were deposited by reactive magnetron sputtering, employing an atmosphere comprising argon at 6.2 mTorr and oxygen at 1.4 mTorr.

The metal contacts comprised nickel, about 10 µm wide and about 0.1 to 0.2 µm thick. The metal contacts were deposited on a chemically cleaned $SiO_2$-coated silicon substrate, prior to deposition of the $MnO_{2-x}$ film, using a DC magnetron sputtering source, such as available from US Inc. (Campbell, Calif.). The test structure was fabricated with a feature size of 10 µm utilizing conventional photolithography and a lift-off micro-fabrication technique employing a chlorobenzene soak process. The substrates were mounted for metallization about 18 cm away from the target. Argon was used as the carrier gas (about 10 mTorr) during sputtering. The typical rate of deposition was 1 Å/sec. The metal contacts were deposited and patterned prior to deposition and patterning of the manganese dioxide films.

Figure 3:
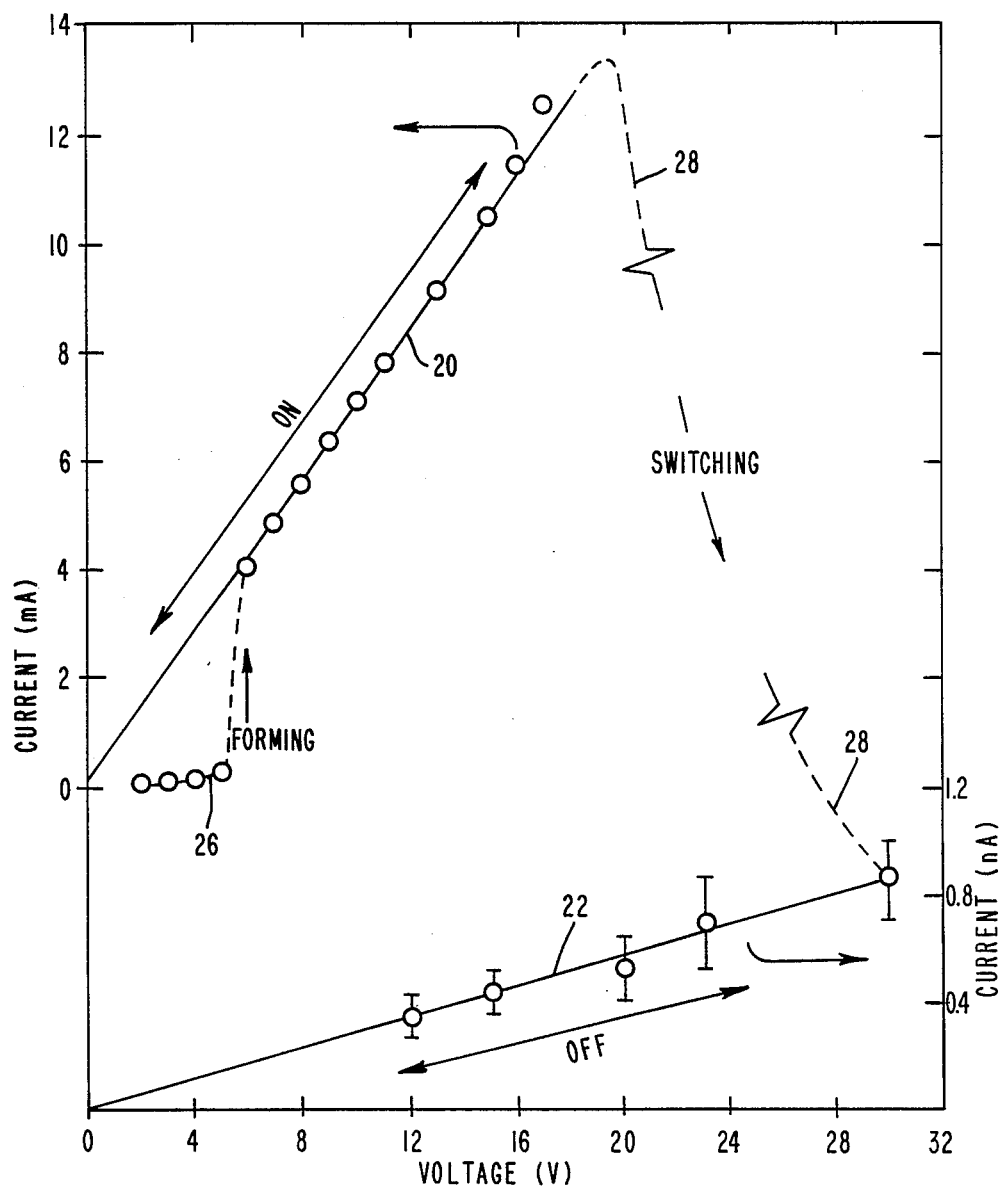
FIG. 3, on coordinates of current (in milli-Amperes) and voltage (in volts), is a plot depicting the current-voltage characteristics of $MnO_{2-x}$ thin films, measured in a sandwich geometry by a microprobe tester.

FIGS. 2 and 3 show resistance-voltage and current-voltage characteristics, respectively, of such films. Regions 26, 20, 28, and 22 represent forming, ON state, switching, and OFF state, respectively.

The electrical current induced the formation of a high resistivity ($10^5$ to $10^8$ Ω-cm) oxide of manganese, which is believed to be the cause of an irreversible memory switching from a low resistivity "formed" resistance of about 3 Ω-cm) $MnO_{2-x}$ thin films.

Resistivity-temperature characteristics of as-deposited $MnO_{2-x}$ films studied independently in air or in oxygen confirmed the above results. Initially, the resistivity of as-deposited $MnO_{2-x}$ films (50 to 500 Ω-cm) decreased with increasing temperature up to about 300° C. This may be identified as "forming" of the device into its "ON" state. This state (1 to 10 Ω-cm) is stable up to about 450° C. On subsequent heating up to about 500° C., $MnO_{2-x}$ films transformed into highly resistive ($>10^5$ to $10^8$ Ω-cm) oxide of manganese. It is important to note that the resistivity of $MnO_{2-x}$ films is stable in the "ON" as well as the "OFF" state over a period of days even when maintained at about 100° C. once they are "formed" or "switched".

2. Thin Film Arrays.

Synaptic test structures 10 were fabricated by using sputter-deposited nickel films (10 µm wide wires) as top 16a and bottom 16b contacts. Polyimide islands 18 were formed photolithographically to serve as insulator between the nickel wires where they crossed directly over each other.

$MnO_{2-x}$ films 12 were deposited on a glass substrate 14 by reactive dc magnetron sputtering of Mn target in a mixture of high purity Ar and $O_2$ gases (partial pressures of 6.2 mTorr and 1.4 mTorr, respectively). The deposition rate was typically 0.2 to 0.3 Å/sec.

$MnO_{2-x}$ thin films were used to form switching (ON→OFF) elements (about 5 µm×5 µm) as well as current limiting resistors. The test structures were based on short linear elements having dimensions of 10 µm×50 µm. They were fabricated by utilizing conventional photolithography and lift-off techniques.

FIG. 4 shows a pair of a synaptic array. Horizontal lines with vertical tabs and vertical lines with horizontals tabs (as shown in FIG. 1) comprised the contacts 16a, 16b and were fabricated using nickel. The L-shaped islands 18 comprised polyimide.

Reactively sputtered $MnO_{2-x}$ thin films formed synaptic elements 12 (about 5 µm×5 µm) on each of the vertical and horizontal tab pair 16a, 16b. The resulting "ON" state resistance of a "formed" synapse (FIG. 1 in a planar geometry, about 25 µm²) was about $4\times10^6$ Ω. The element switched to $>10^{10}$ upon application of an electrical signal of about 50 V with a pulsewidth of about 500 µsec.

The tailorability of the "ON" state resistance of the synapses depended primarily on the deposition parameters (i.e., $Ar/O_2$ ratio), as discussed above. The precision in "ON" resistance was essentially controlled by the geometry of the synapse, as discussed above.

One of the most important requirements for the synapses is their stability when they are subjected to a current during the "read" cycle. Stability tests indicated that the resistance of the "ON" state synapse was unchanged upon an application of 5 V DC electrical signal ($\approx 1$ µA current) over a period of about 24 hours.

Thus, there has been provided a memory switch which may also be used as a synaptic resistor, adapted for use with neural networks. It will be clear to one skilled in the art that various changes and modifications of an obvious nature may be made, and all such changes and modifications are considered to fall within the scope of the invention, as defined by the appended claims.

What is claimed is:

1. An irreversible memory switch (10) comprising a thin film (12) of a metal oxide system capable of exhibiting an OFF/ON resistance ratio of at least about $10^3$ upon application of at least one of a suitable electrical pulse or a suitable elevated temperature, said metal oxide system comprising a metal oxide of a first composition having a deposition-dependent resistivity which may be converted to a metal oxide of a second composition having a resistivity much higher than that of said first composition.

2. The memory switch of claim 1 wherein said metal oxide system consists essentially of a pair of oxides selected from the group consisting of $MnO_{2-x}/Mn_2O_3$ and $PbO_{2-x}/PbO$.

3. The memory switch of claim 2 wherein said metal oxide system consists essentially of a first composition of $MnO_{2-x}$ and a second composition of $Mn_2O_3$.

4. The memory switch of claim 1 formed on an electrically and thermally insulating substrate (14).

5. An irreversible memory switch (10) comprising a thin film (12) of a metal oxide system capable of exhibiting an OFF/ON resistance ratio of at least about $10^3$ upon application of at least one of a suitable electrical pulse or a suitable elevated temperature and provided with a pair of electrically conducting electrodes (16a, 16b), separated by said thin film and electrically contacted thereby, said metal oxide system comprising a metal oxide of a first composition having a deposition-dependent resistivity which may be converted to a metal oxide of a second composition having a resistivity much higher than that of said first composition.

6. The memory switch of claim 5 wherein said metal oxide system consists essentially of a pair of oxides selected from the group consisting of $MnO_{2-x}/Mn_2O_3$ and $PbO_{2-x}/PbO$.

7. The memory switch of claim 6 wherein said metal oxide system consists essentially of a first composition of $MnO_{2-x}$ and a second composition of $Mn_2O_3$.

8. An array (24) of irreversible memory switches (10) comprising a thin film (12) of a metal oxide system capable of exhibiting an OFF/ON resistance ratio of at least about $10^3$ upon application of at least one of a suitable electrical pulse or a suitable elevated temperature and provided with a pair of electrically conducting electrodes (16a, 16b), separated by said thin film and electrically contacted thereby and formed on an electrically and thermally insulating substrate, said metal oxide system comprising a metal oxide of a first composition having a deposition-dependent resistivity which may be converted to a metal oxide of a second composition having a resistivity much higher than that of said first composition.

9. The array of claim 8 wherein said metal oxide system consists essentially of a pair of oxides selected from the group consisting of $MnO_{2-x}/Mn_2O_3$ and $PbO_{2-x}/PbO$.

10. The array of claim 9 wherein said metal oxide system consists essentially of a first composition of $MnO_{2-x}$ and a second composition of $Mn_2O_3$.

* * * * *